US012787247B2

(12) United States Patent
Tung et al.

(10) Patent No.: US 12,787,247 B2
(45) Date of Patent: Nov. 3, 2026

(54) SEMICONDUCTOR DEVICE AND METHOD OF FABRICATING THE SAME

(71) Applicant: Fujian Jinhua Integrated Circuit Co., Ltd., Quanzhou City (CN)

(72) Inventors: Yu-Cheng Tung, Quanzhou City (CN); Janbo Zhang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 301 days.

(21) Appl. No.: 18/777,583

(22) Filed: Jul. 19, 2024

(65) Prior Publication Data

US 2025/0311186 A1 Oct. 2, 2025

(30) Foreign Application Priority Data

Mar. 26, 2024 (CN) ........................ 202410353887.6

(51) Int. Cl.
*H10B 12/00* (2023.01)
*H10W 20/43* (2026.01)

(52) U.S. Cl.
CPC ............ *H10B 12/00* (2023.02); *H10W 20/43* (2026.01)

(58) Field of Classification Search
CPC .... H10W 72/20; H10W 72/019; H10W 72/90
See application file for complete search history.

(56) References Cited

U.S. PATENT DOCUMENTS

2016/0370900 A1* 12/2016 Chan .................... G06F 3/0445

* cited by examiner

*Primary Examiner* — Mohammad A Rahman
(74) *Attorney, Agent, or Firm* — Winston Hsu

(57) ABSTRACT

The present disclosure provides semiconductor device and a fabricating method thereof, including a plurality of first extension pads, an extension margin, a plurality of second extension pads, and at least one third extension pad. The first extension pads are separated from each other and each includes a first length. The extension margin is disposed at one side of all of the first extension pads, and includes a plurality of branch extension pads. The second extension pads are separately disposed between the branch extension pads and each includes a second length. The third extension pad is disposed between a corresponding one of the second extension pad and the first extension pads, or disposed between a corresponding one of the branch extension pads and the first extension pads and includes a third length, with the third length being larger than the first length and smaller than the second length.

20 Claims, 6 Drawing Sheets

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor device including an extension pad array, and a method of fabricating the same.

2. Description of the Prior Art

With the trend of miniaturization of various electronic products, the design of semiconductor devices must also meet the requirements of high integration and high density. Under the current mainstream of development trend, dynamic random access memories (DRAMs) having recessed gate structures have gradually replaced the DRAMs having only planar gate structures due to longer carrier channel length for the same semiconductor substrate so as to reduce current leakage of capacitor structures. In general, a DRAM cell with a recessed gate structure includes a transistor component and a charge storage device to receive voltage signals from bit lines and word lines. However, due to the limitations of current processing technologies, there are still many defects in currently available DRAM cells with recessed gate structures, which need to be further improved to effectively improve the performance and reliability of related memory devices.

SUMMARY OF THE INVENTION

An object of the present disclosure is to provide a semiconductor device and a method of fabricating the same, where extension pads and/or branch extension pads with various lengths are arranged around an outer periphery of the extension pad array, to improve the structural defects of the semiconductor device possibly caused by continuously increased cell-density, and to gain components with improved reliability, and to achieve an optimized performance and operation.

In order to achieve the above object, an embodiment of the present disclosure provides a semiconductor device including a plurality of first extension pads, an extension margin, a plurality of second extension pads, and at least one third extension pad. The first extension pads are separated from each other and arranged in a first direction and a second direction, wherein each of the first extension pads includes a first length in the first direction. The extension margin is disposed at one side of all of the first extension pads and is extended in a third direction, and which includes a plurality of branch extension pads in the first direction. The second extension pads are separately disposed between the branch extension pads in a third direction, wherein each of the second extension pad includes a second length in the first direction. The at least one third extension pad is disposed between a corresponding one of the second extension pad and the first extension pads, or disposed between a corresponding one of the branch extension pads and the first extension pads, wherein the at least one third extension pad includes the third length in the first direction. The third length is larger than the first length and is smaller than the second length.

In order to achieve the above object, an embodiment of the present disclosure provides a method of fabricating a semiconductor device, including the following steps. A plurality of first extension pads is separated from each other and arranged in a first direction and a second direction, wherein each of the first extension pads includes a first length in the first direction. An extension margin is disposed at one side of all of the first extension pads and is extended in a third direction, and includes a plurality of branch extension pads in the first direction. A plurality of second extension pads is separately between the branch extension pads in the third direction, wherein each of the second extension pads includes a second length in the first direction. At least one third extension pad is between a corresponding one of the second extension pad and the first extension pads, or between a corresponding one of the branch extension pads and the first extension pads, wherein the at least one third extension pad includes a third length in the first direction. The third length is larger than the first length and is smaller than the second length.

Overall, the extension pads and/or branch extension pads with various lengths are formed by intentionally adjusting the interleaved patterns respectively formed in two self-aligned reverse patterning processes, so that, the storage node pads formed adjacent to the extension pads and/or branch extension pads with various lengths enable to obtain a complete outline and a uniform length, without generating any structural defects. In this way, the semiconductor device of the present disclosure will therefore obtain a more reliable structure and improved components, so as to achieve an optimized performance and operation.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 2 to FIG. 5 are schematic diagrams illustrating a method of fabricating a semiconductor device according to the first embodiment of the present disclosure, wherein;

FIG. 2 is a schematic top view of a semiconductor device after performing a first self-aligned reverse pattering process;

FIG. 3 is a schematic top view of a semiconductor device after performing a first etching process;

FIG. 4 is a schematic top view of a semiconductor device after performing a second self-aligned reverse pattering process; and FIG. 5 is a schematic top view of a semiconductor device after performing a second etching process.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
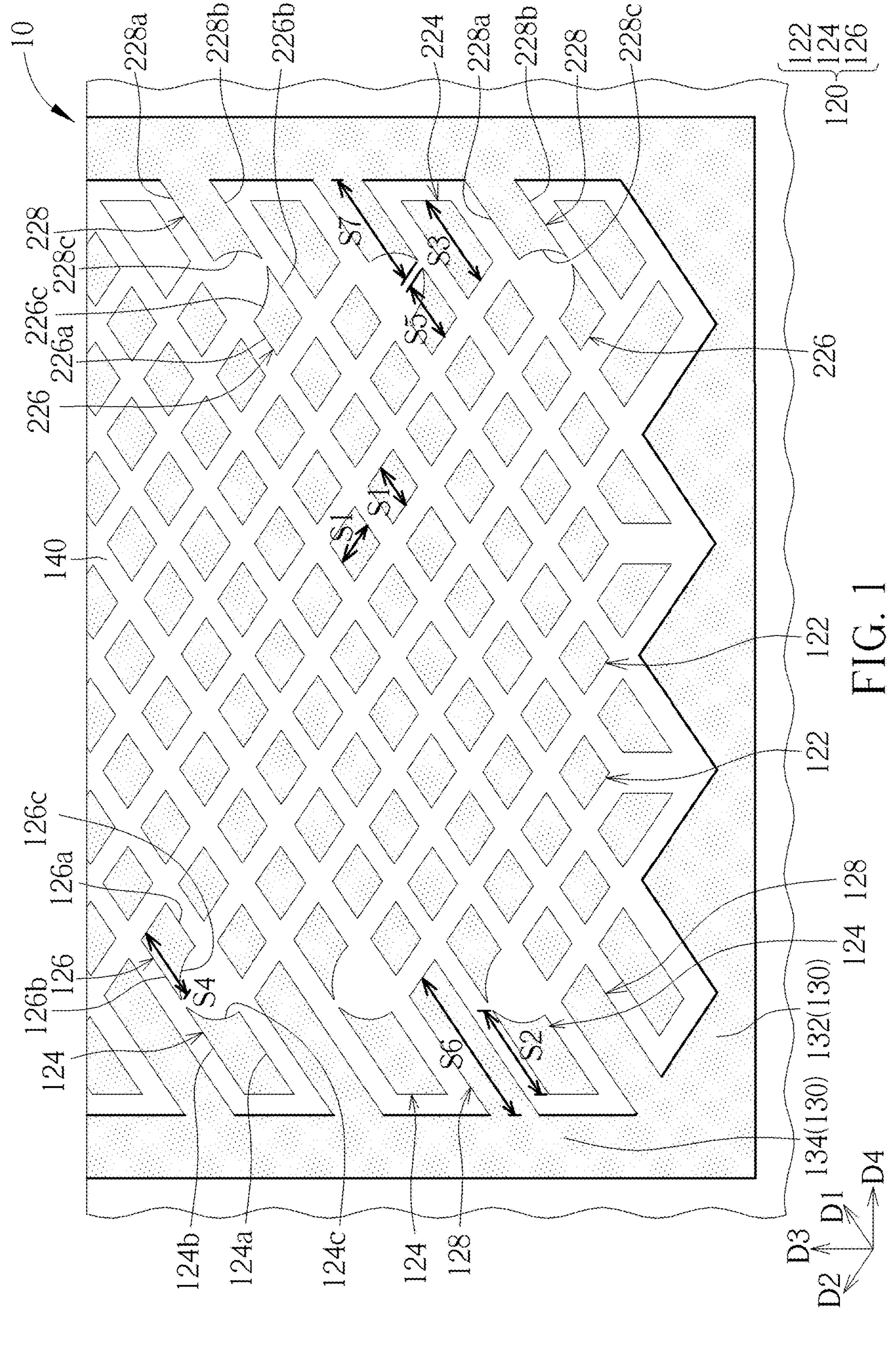
FIG. 1 is a schematic diagram illustrating a semiconductor device according to a first embodiment of the present disclosure.

Please refer to FIG. 1, which is a schematic diagram illustrating a top view of a semiconductor device 10 according to the first embodiment of the present disclosure. The semiconductor device 10 includes a plurality of first extension pads 122, a plurality of second extension pads 124, 224, at least one third extension pad 126, 226, and an extension margin 130. The first extension pads 122 are separately disposed in a first direction D1 and a second direction D2 being intersecting with and not perpendicular to each other, to serve as the storage node pads (SN pads) of the semiconductor device 10. Each of the first extension pads 122 has a first length S1 either in the first direction D1 or in the second direction D2. The extension margin 130 is disposed at one side of all of the first extension pads 122, and further includes a plurality of branch extension pads 128, 228 extending in the first direction D1. The second extension pads 124/224 each separately disposed between any two of the branch extension pads 128/228 in a third direction D3 and includes a second length S2/S3 in the first direction D1. The third extension pad 126 is for example disposed between one of the second extension pads 124 and a corresponding first extension pad 122 in the first direction D1, to include a third length S4. Alternately, the third extension pad 226 is disposed between one of the branch extension pads 228 and a corresponding first extension pad 122 in the first direction D1, to include a third length S5. The third length S4/S5 of the third extension pad 126/226 is larger than the first length S1 and is smaller than the second length S2/S3 of the second extension pads 124/224. The first extension pads 122, the second extension pads 124, 224, and at least one third extension pad 126, 226 are together arranged into an extension pad array 120, with the second extension pads 124/224 and the third extension pad 126/226 with various lengths being arranged at the outer periphery of the extension pad array 120. It is noted that, by arranging the second extension pads 124/224 and the third extension pad 126/226 with various lengths at the periphery of the extension pad array 120, the first extension pads 122 adjacent to the second extension pads 124/224 and the third extension pad 126/226 are able to obtain a complete outline, thereby improving the structural defects possibly derived from the fabricating process of the semiconductor device 10. In this way, the semiconductor device 10 will gain components with improved reliability and better structure, and to achieve an optimized performance and operation.

Precisely, speaking, as shown in FIG. 1, a plurality of the third extension pads 126 are alternately arranged with the branch extension pads 128 in the third direction D3, with each of the third extension pads 126 having the third length S4, and also, a plurality of the third extension pads 226 are alternately arranged with the second extension pads 224 in the third direction D3, with each of the third extension pads 126 having the third length S5. The second length S2 of each second extension pad 124 and the third length S4 of each third extension pad 126 are both smaller than a length S6 of each branch extension pad 128 in the first direction D1, the second length S3 of each second extension pad 224 and the third length S5 of each third extension pad 226 are both smaller than a length S7 of each branch extension pas 228 in the first direction D1, and the length S6 of each branch extension pad 128 is greater than the length S7 of each branch extension pas 228, but not limited thereto. In one embodiment, the second length S2/S3 and the third length S4/S5 each refers to a greatest length or an average length of each second extension pad 124/224 or each third extension pad 126/226, but not limited thereto. Further in view of FIG. 1, the third extension pad 126/226 includes a first side 126*a*/226*a* and a second side 126*b*/226*b* opposite to each other, with the first side 126*a*/226*a* having a length being smaller than that (namely the third length S4/S5) of the second side 126*b*/226*b* in the first direction D1. That is, two parallel sides of each third extension pad 126/226 are preferably in different lengths in the first direction D1, and the first extension pads 122 adjacent thereto will therefore obtain a complete outline and a uniform length (namely, the first length S1). It is noted that, the third extension pad 126/226 further includes an arc-shaped side 126*c*/226*c* with two ends thereof respectively connecting the first side 126*a*/226*a* and the second side 126*b*/226*b* at the same time. The arc-shaped side 126*c* is disposed for example facing to an arc-shaped side 124*c* of an adjacent one of the second extension pads 124, so that, the arc-shaped side 126*c* of the third extension pad 126 and the arc-shaped side 124*c* of the adjacent second extension pad 124 are opposite to each other, substantially in a symmetrical manner as shown in FIG. 1, but not limited thereto. Also, the arc-shaped side 226*c* is disposed facing an arc-shaped side 228*c* of an adjacent one of the branch extension pads 228, so that, the arc-shaped side 226*c* of the third extension pad 226 and the arc-shaped side 228*c* of the adjacent branch extension pad 228 are opposite to each other, also in a symmetrical manner.

The second extension pads 124, the branch extension pads 228 each includes a third side 124*a*/228*a* and a fourth side 124*b*/228*b* opposite to each other, with the third side 124*a* of each second extension pad 124 having a length being smaller than that (namely the second length S2/S3) of the fourth side 124*b* in the first direction D1, and with the third side 228*a* of each branch extension pad 228 having a length being also smaller than that (namely the length S7) of the fourth side 228*b* in the first direction D1. It is also noted that, the third side 124*a* of each second extension pad 124 and the first side 126*a* of each third extension pad 126 are colinear in the first direction D1, and just aligned with a side of any first extension pads 122 arranged in a corresponding row in the first direction D1, while the fourth side 124*b* of each second extension pad 124 and the second side 126*b* of each third extension pad 126 are also colinear in the first direction D1, and just aligned with another side of any first extension pads 122 arranged in the corresponding row. On the other hand, the third side 228*a* of each branch extension pad 228 and the first side 226*a* of each third extension pad 226 are colinear in the first direction D1, and also just aligned with a side of any first extension pads 122 arranged in another corresponding row in the first direction D1, while the fourth side 228*b* of each branch extension pad 228 and the second side 226*b* of each third extension pad 226 are also colinear in the first direction D1, and just aligned with another side of any first extension pads 122 arranged in the another corresponding row, as shown in FIG. 1. Accordingly, the fabrications of the second extension pads 124 and the third extension pads 126, as well as the fabrications of the branch extension pads 228 and the third extension pads 226, may be carried out in the same process to maintain the contour integrity of the first extension pads 122 adjacent to the second extension pads 124, the third extension pads 126/226, and the branch extension pads 228, but not limited thereto.

Further in view of FIG. 1, the extension margin 130 precisely includes at least one first edge 132 in a fourth direction D4 being perpendicular to the third direction D3, and at least one second edge 134 in the third direction D3, and the branch extension pads 128 and the branch extension pads 228 are preferably disposed on two different second edges 134, with one end of each second edge 134 being connected to at least one second edge 134. Accordingly, the extension margin 130 is disposed around the first extension pads 122, the second extension pads 124, and the third extension pads 126, 226, but not limited thereto. In one embodiment, the extension margin 130 may include two opposite first edges 132 and two opposite second edges 134, to overall present in a rectangular frame surrounding outside the first extension pads 122, the second extension pads 124, and the third extension pads 126, 226. Alternately, the extension margin 130 may further include other portions connecting the first edges 132, to overall present in other structures also surrounding outside the first extension pads 122, the second extension pads 124, and the third extension pads 126, 226. In this way, the branch extension pads 128 located at one side of the extension pad array 120 are each between one second edge 134 and a corresponding one of the first extension pads 122 in the first direction D1, and the second extension pad 124 located at the same side of the extension pad array 120 are each between the second edge 134 and a corresponding one of the third extension pads 126. The branch extension pads 228 located at another side of the extension pad array 120 are each between another second edge 134 and a corresponding one of the third extension pads 226 in the first direction D1, and the second extension pads 224 also located at the another side of the extension pad array 120 are each between the another second edge 134 and a corresponding one of the first extension pads 122 in the first direction D1, as shown in FIG. 1, but not limited thereto.

The semiconductor device 10 further includes a substrate 100 and a dielectric layer 140 disposed on the substrate 100. The substrate 100 for example includes a silicon substrate, a silicon-containing substrate, e.g., SiC or SiGe, a silicon-on-insulator (SOI) substrate, or a substrate formed of any other suitable material, but not limited thereto. The above-mentioned extension pad array 120 is disposed on the substrate 100, and the dielectric layer 140 is disposed around each first extension pad 122, each second extension pad 124, 224, and each third extension pad 126, 226. Then, a portion of the dielectric layer 140 is disposed between the second edge 134 of the extension margin 130 and each third extension pad 126, physically contacting the arc-shaped side 126*c* of each third extension pad 126 and the arc-shaped side 124*c* of each second extension pad 124, and another portion of the dielectric layer 140 is disposed between the second edge 134 of the extension margin 130 and each third extension pad 226, physically contacting the arc-shaped side 226*c* of each third extension pad 226 and the arc-shaped side 228*c* of each branch extension pad 228. The first extension pads 122 of the extension pad array 120 are electrically connected to corresponding plugs (not shown in the drawings) disposed on the substrate 100, respectively, to serve as the storage node contact (SNC) of the semiconductor device 10 for connecting word lines (not shown in the drawings) disposed within the substrate 100, and the capacitors (not shown in the drawings) disposed over the extension pad array 120. Those of ordinary skill in the art would easily understand that various components such as transistor components, word line components and/or bit line components, may be arranged between the storage node pad structure 120 and the substrate 100 or in the substrate 100 according to actual requirements, so as to form a dynamic random access memory (DRAM) device to achieve better performance.

According to the semiconductor device 10 of the present embodiment, extension pads (including the second extension pads 124, 224 and the third extension pads 126, 226) and/or the branch extension pads (including the branch extension pads 128, 228) with various lengths are arranged around an outer periphery of the extension pad array 120, such that, the storage node pads adjacent thereto will easily obtain a complete outline and a uniform length, without generating any structural defects during the fabricating thereof. With these arrangements, the semiconductor device 10 of the present embodiment enables to gain components with improved reliability, and to achieve an optimized performance and operation thereby. Those of ordinary skill in the art would easily understand that although the extension pads (including the first extension pads 122, the second extension pads 124, 224, and the third extension pads 126, 226) and/or the branch extension pads (including the branch extension pads 128, 228) are all substantially in a quadrangular shape for clearly defining the locations and the length therebetween, and the practical shapes thereof are not limited thereto. The extension pads and/or the branch extension pads of the present disclosure may include any suitable shape by adjusting the fabrication of the extension pad array 120.

In order to make those having ordinary skills in the art easily understand the semiconductor device 10 according to the present disclosure, a fabricating method of the semiconductor device 10 according to the present disclosure will be further described as follows.

Figure 2:
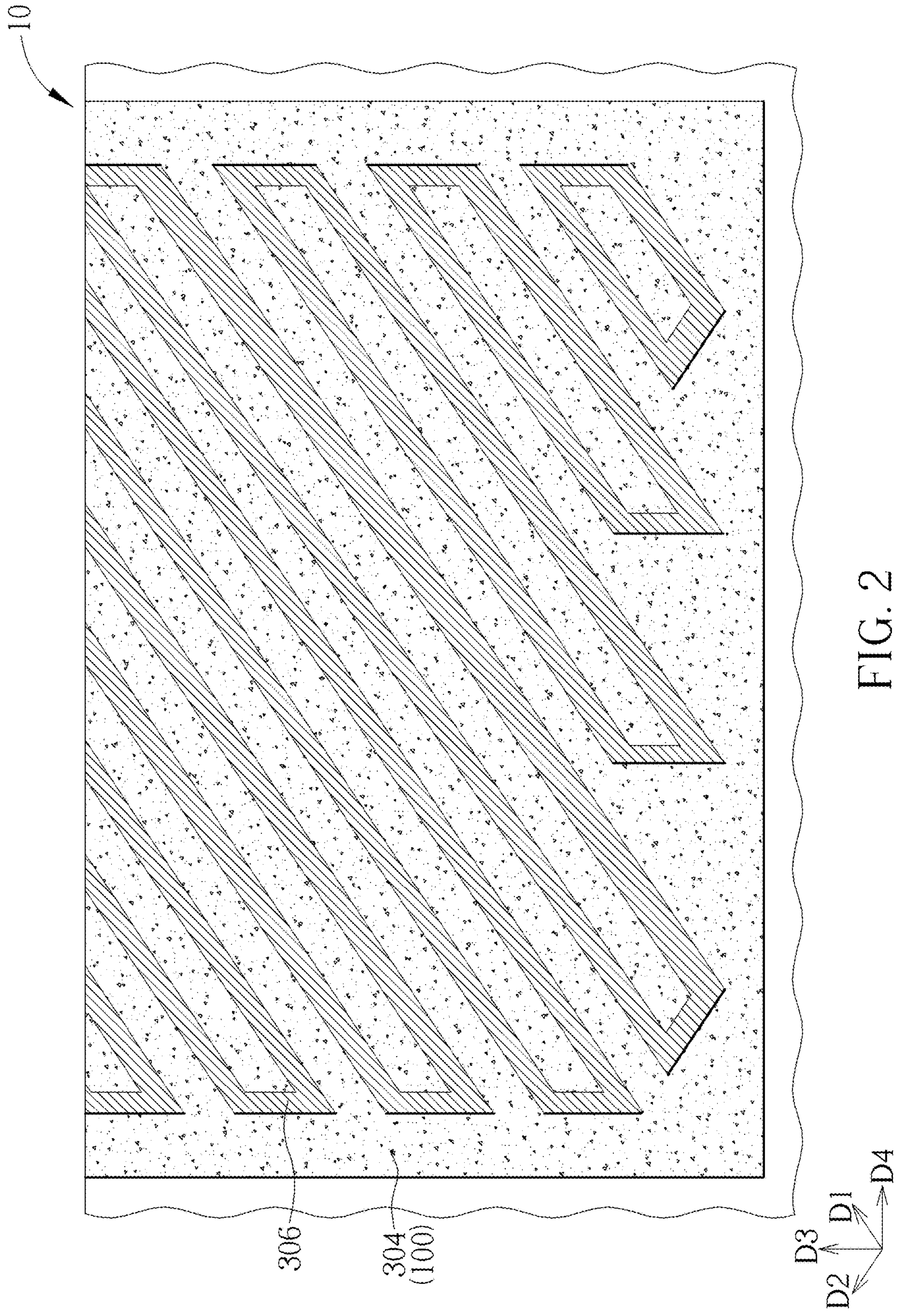

Please refer FIG. 2 to FIG. 5, which are schematic diagrams illustrating a fabricating method of the semiconductor device 10 according to the first embodiment of the present disclosure. First of all, as shown in FIG. 2, a substrate 100 is provided, and a conductive material layer (not shown in the drawings), a hard mask layer 302 (nor shown in FIG. 2) and a mask layer 304 are sequentially formed on the substrate 100. In one embodiment, the conductive material layer for example contains a low-resistance metal material such as aluminum (Al), titanium (Ti), copper (Cu) or tungsten (W), the hard mask layer 302 for example contains a proper mask material such as silicon nitride or silicon carbonitride, the mask layer 304 for example contains a proper mask material such as amorphous silicon, but not limited thereto. Afterwards, a first mask structure (not shown in the drawings) is formed on the mask layer 304, with the first mask structure preferably including a multi-layer structure for example containing an organic bottom layer (not shown in the drawings), a silicon hard mask bottom anti-reflective coating layer (not shown in the drawings) and a plurality of first mask patterns 306 being formed through a first self-aligned reverse patterning (SARP) process, stacked in sequence. The first mask patterns 306 are separately extended in the first direction D1 and each includes a rectangular frame, as shown in FIG. 2, but not limited thereto. In order to clearly illustrate the patterning process of the present embodiment, components like the organic bottom layer and the silicon hard mask bottom anti-reflective coating layer covering on the mask layer 304 are omitted from the drawings of the present embodiment, and the first mask patterns 306 with the specific patterns have remained in the drawings of the present embodiment.

Figure 3:
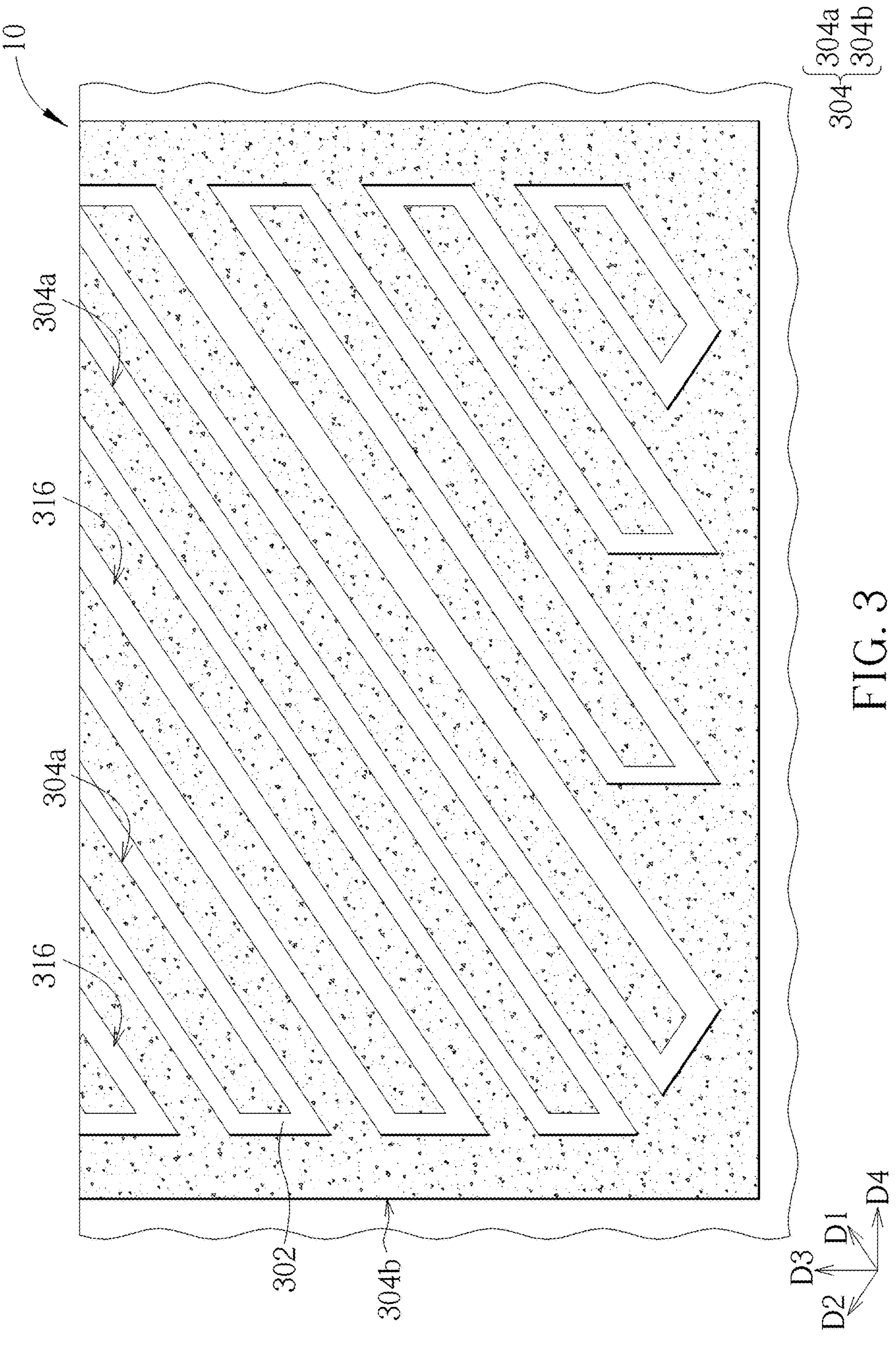

As shown in FIG. 3, a first etching process is performed through the first mask structure, sequentially transferring the rectangular frame of each first mask pattern 306 into the silicon hard mask bottom anti-reflective coating layer and the organic bottom layer, followed by further transferring into the mask layer 304 underneath, to form a plurality of first openings 316 in the mask layer 304, with each of the openings 316 containing a shape of rectangular frame. Also, a plurality of mask patterns 304*a* in stripe-shape and an outermost boundary pattern 304*b* are also formed in the mask layer 304 through the first etching process, with each mask pattern 304*a* extending in the first direction D1 within the rectangular frame of each opening 316. Accordingly, the hard mask layer 302 formed under the mask layer 304 is therefore exposed from the first openings 316, as shown in FIG. 3. Then, the first mask structure is completely removed after the first etching process.

Figure 4:
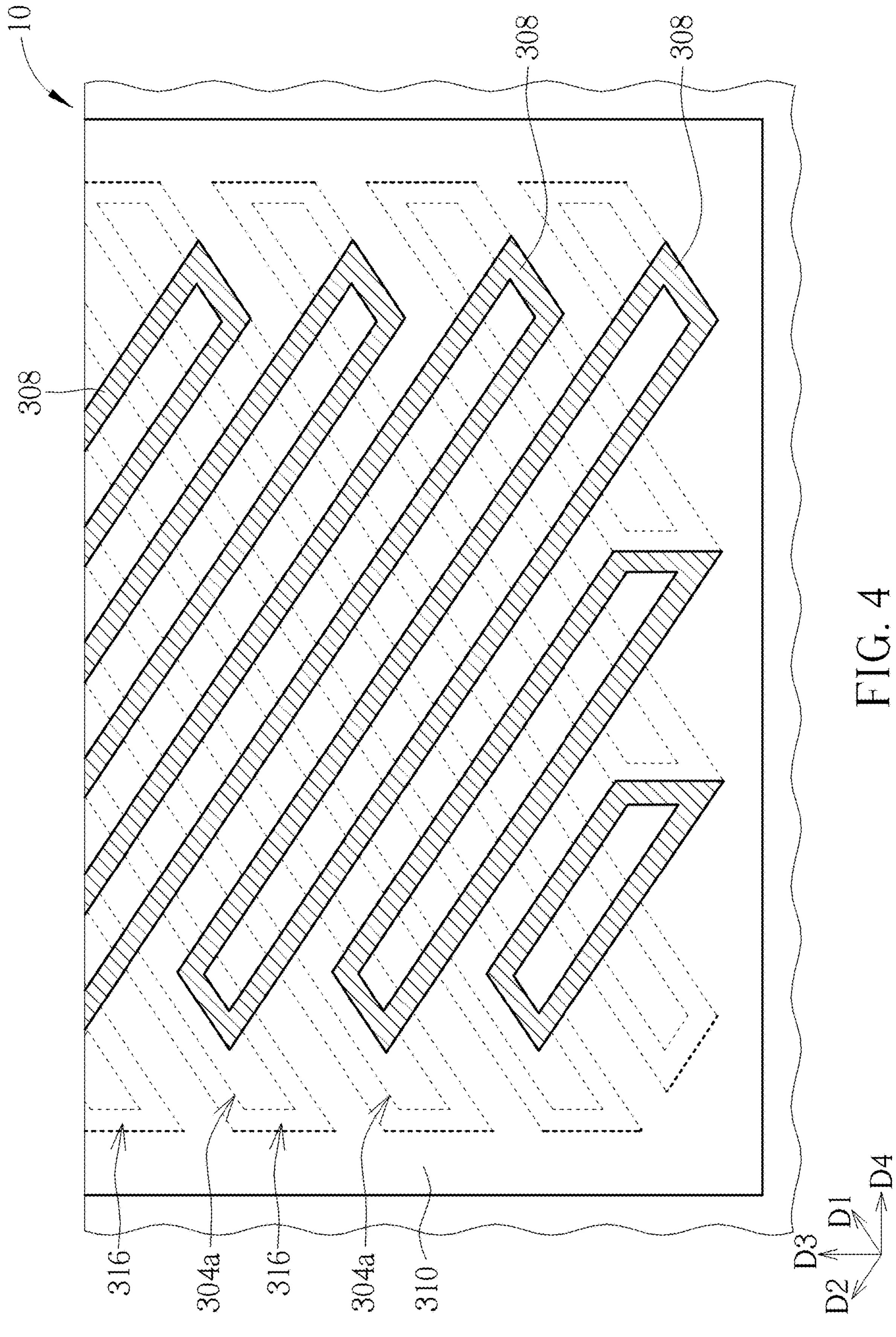

Next, a second mask structure (not shown in the drawings) is formed on the mask layer 304, covering the first openings 316. The second mask structure also includes a multilayer structure containing an organic bottom layer (not shown in the drawings), a silicon hard mask bottom anti-reflective coating layer 310 and a plurality of first mask patterns 308 being formed through a second self-aligned reverse patterning process, stacked in sequence on the mask layer 304. As shown in FIG. 4, the second mask patterns are separately extended in the second direction D2, and each includes a pattern of rectangular frame, but not limited thereto. It is noted that, each of the second mask patterns 308 interleaves with at least one of the first openings 316 disposed underneath. In order to clearly illustrate the patterning process, the organic bottom layer of the second mask structure is omitted from the drawings of the present embodiment, and the silicon hard mask bottom anti-reflective coating layer 310 and the second mask patterns 316 with the specific patterns have remained in the drawings of the present embodiment.

Figure 5:
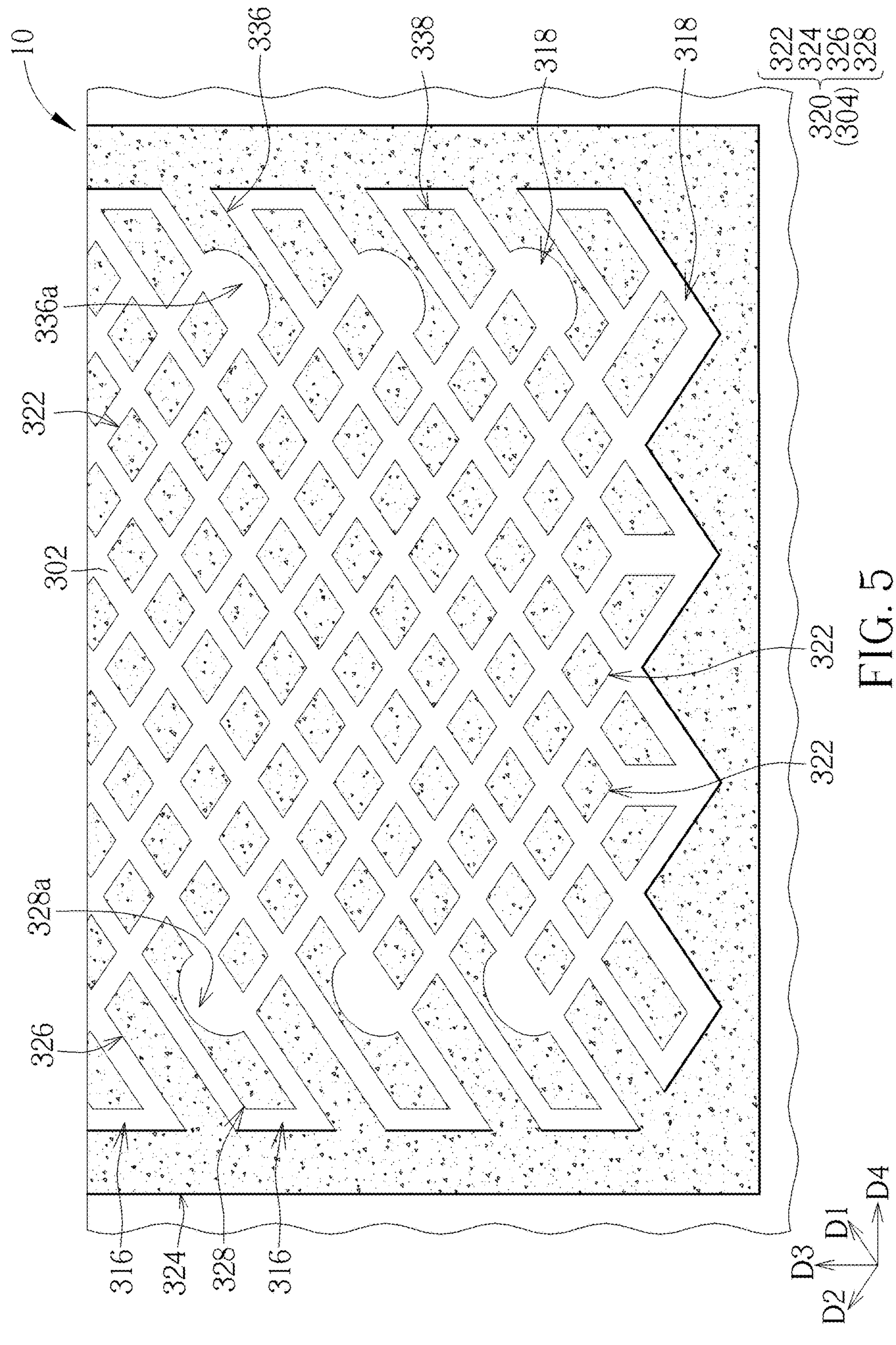

As shown in FIG. 5, a second etching process is performed through the second mask structure, sequentially transferring the rectangular frame of each second mask pattern 308 into the silicon hard mask bottom anti-reflective coating layer 310 and the organic bottom layer, followed by further transferring into the mask layer 304 underneath, to form a plurality of second openings 318 also having a shape of rectangular frame in the mask layer 304. Then, the hard mask layer 302 under the mask layer 304 is therefore exposed from the first openings 316 and the second openings 318, as shown in FIG. 5, and the second mask structure is completely removed. Through these performances, the second openings 318 and the first openings 316 are staggered and overlapped with each other, such that, the mask layer 304 is etched into a pattern layout 320 that is expected to form the extension pad array 120. The pattern layout 320 includes a plurality of first patterns 322 separately arranged in the first direction D1 and in the second direction D2, a second pattern 324 around all of the first patterns 322, a plurality of third patterns 326, 336 between the first patterns 322 and the second pattern 324 and physically contacting the second pattern 324, and a plurality of fourth patterns 328, 338 between the first patterns 322 and the second pattern 324 and not contacting the second pattern 324, as shown in FIG. 5.

Afterward, at least one etching process is performed to sequentially transfer the pattern array 320 into the hard mask layer 302 and the conductive material layer underneath, to form the extension pad array 120 as shown in FIG. 1 in the conductive material layer. A dielectric material layer (not shown in the drawings) is then formed on the substrate 100, followed by performing a planarization process on the dielectric material layer, to form the dielectric layer 140 surrounding the extension pad array 120. It is noted that, while performing the second etching process, each second mask pattern 308 is intentionally made to interleave plural first openings 316 underneath, and to partially interleave at least one first opening 316 underneath. That is, a short-end of each second mask pattern 308 in the first direction D1 will right overlap one corresponding mask pattern 304*a* in a vertical direction of the substrate 100 as shown in FIG. 4. Accordingly, each second opening 318 being formed through the second mask patterns 308 cannot effectively cut off the aforementioned one corresponding mask pattern 304*a*, thereby forming the fourth patterns 328 having a recess portion 328*a* and the third patterns 336 having a recess portion 336*a* as shown in FIG. 5. The aforementioned one corresponding mask pattern 304*a* may contact or not contact to the outermost boundary pattern 304*b* optionally, such that, the fourth patterns 328 having the recess portion 328*a* and the third patterns 336 having the recess portion 336*a* may contact or not contact the outermost second pattern 324, accordingly. Furthermore, due to the optical proximity effect, the short-end of each second mask pattern 308 is easy to shrink or rounding during multi-patterning processes. That is, the recess portion 328*a* of the fourth patterns 328, and the recess portion 336*a* of the third patterns 336 may respectively have an arc recessing profile by adjusting the etching conditions of at least one etching process, but not limited thereto.

In a preferably embodiment, the fourth patterns 328 and the third patterns 336 are nearly cut off by the recess portions 328*a* and the recess portions 336*a* as shown in FIG. 5, instead of being completely cut off by the recess portions 328*a* and the recess portions 336*a*. While the four patterns 328 and the third pattern 336 are then transferred to the hard mask layer 302 and the conductive material layer disposed underneath, the corresponding hard mask patterns (not shown in the drawings) and the corresponding conductive patterns (not shown in the drawings) are cut off by the transferring patterns of the recess portions 328*a* and the recess portions 336*a* through adjusting the etching conditions thereof. Then, the second extension pads 124, 224, and the third extension pad 126, 226 as shown in FIG. 1 are formed accordingly. Meanwhile, the first extension pads 122, the extension margin 130, the branch extension pads 128, and the second extension pads 224 are also formed through transferring the first patterns 322, the second pattern 324, the third patterns 326, and the fourth patterns 338 into the conductive material layer. People skilled in the art should fully realize that the practical shape of the extension pads and/or the branch extension pad are not limited to what is shown in FIG. 1, and which may include various shape by further adjusting the parameters of the above-mentioned etching process, for example rounding the mask patterns during being transferred into the mask layer 304 and the conductive material layer.

Through these arrangements, the second extension pads 124, 224, and the third extension pads 126, 226 with various lengths are formed around an outer periphery of the extension pad array 120, such that, the first extension pads 122 formed adjacent to the second extension pads 124, 224, and the third extension pads 126, 226 will not have the structural defects caused by the optical proximity effect or the pattern misalignment, so as to obtain a complete outline and a uniform lengthy. Accordingly, the semiconductor device 10 being formed by the fabricating process of the present embodiment enables to gain components with improved reliability, and to achieve an optimized performance and operation thereby.

In addition, those of ordinary skill in the art would easily understand that various components such as transistor components, word line components, bit line components, and/or plug components may be additionally fabricated either in the substrate 100, between the substrate 100 and the extension pad array 120, or over the extension pad array 120 due to practical product requirements. In other words, the following processes may be carried out before forming the extension pad array 120, but not limited thereto. For example, a shallow trench isolation (not shown in the drawings) may be formed in the substrate 100, and a plurality of buried gate structures (not shown in the drawings) is formed in the substrate 100, serving as buried word lines of the semiconductor device 10. Then, a plurality of bit lines (not shown in the drawings) and a plurality of plugs are formed on the substrate, with the bit lines and the plugs being alternately arranged in a specific direction. It is noted that although the buried word lines and the bit lines are not illustrated in the drawings of the present disclosure, those who skilled in the arts should fully realize the bit lines are parallel with each other in a direction being perpendicular to the buried word lines, with a bit line contact (BLC) disposed underneath to electrically connect to the substrate 100, and with an insulating layer (for example including an oxide-nitride-oxide structure, not shown in the drawings) disposed on the substrate 100 to electrically isolating the curried word lines within the substrate 100. Afterwards, the extension pad array 120 and the dielectric layer 140 are formed through the above-mentioned fabricating method, with each of the first extension pads 122 physically contacting each of the plugs. Then, a capacitor component (not shown in the drawings) is formed over the extension pad array 120, to electrically connect to each of the first extension pads, so that, a dynamic random access memory (DRAM) device is formed thereby to achieve better device performance.

Those of ordinary skill in the art should easily realize the semiconductor device and the fabricating thereof in the present disclosure is not limited to the aforementioned embodiment, and which may include other examples or varieties. The following description will detail the different embodiments of the semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
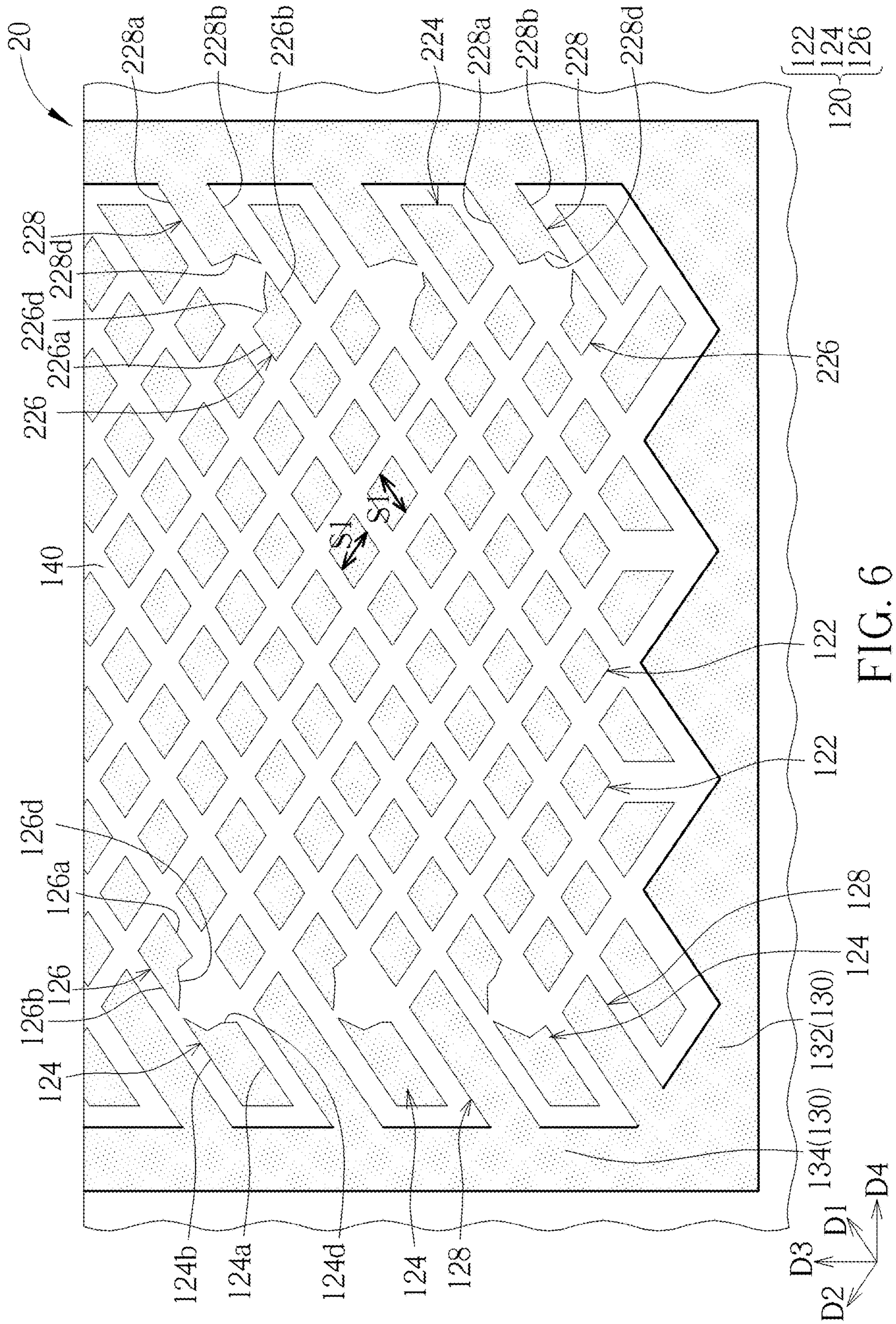
FIG. 6 is a schematic diagram illustrating a semiconductor device according to a second embodiment of the present disclosure.

Please refer to FIG. 6, which is a schematic diagram illustrating a top view of a semiconductor device 20 according to the second embodiment of the present disclosure. The structure and the fabricating process of the semiconductor device 20 in the present embodiment are substantially the same as those of the semiconductor device 10 in the aforementioned embodiment, and the difference therebetween is main in that, the arc-shaped sides **124*d*, 126*d*, 226*d*, 228*d* on the second extension pads 124, the third extension pads 126, 226 and the branch extension pads 228** each has a relative larger surface roughness.

Precisely speaking, while transferring the recess portions **328*a*, of the fourth patterns 328 and the recess portions 336*a* of the third patterns 336 into the hard mask layer 302 and the conductive material layer underneath, the etching conditions are additionally adjusted to form the arc-shaped sides 124*d*, 126*d*, 226*d*, 228*d* on the second extension pads 124, the third extension pads 126, 226 and the branch extension pads 228 in an uneven etching profile, with the uneven etching profiles each having a same or various roughness. It is noted that, the arc-shaped sides 126*d* of the third extension pads 126 are faced to the arc-shaped sides 124*d* of the second extension pads 124 respectively, with one arc-shaped side 126*d* being opposite to a corresponding one of the arc-shaped sides 124*d*, and not in a symmetrical manner. Also, the arc-shaped sides 226*d* of the third extension pads 226 are faced to the arc-shaped side 228*d* of the branch extension pads 228 respectively, with one arc-shaped side 226*d* being opposite to a corresponding one of the arc-shaped sides 228*d***, and also not in a symmetrical manner.

Through these arrangements, the extension pads (for example including the second extension pads 124, 224 and the third extension pads 126, 226) and/or the branch extension pads (for example including the branch extension pads 128, 228) in various lengths are also around at an outer periphery of the extension pad array 120, such that, the storage node pads adjacent thereto will not have the structural defects caused by the optical proximity effect or the pattern misalignment, so as to obtain a complete outline and a uniform length thereby. Accordingly, the semiconductor device 20 of the present embodiment still enables to gain an improved components and more reliable structure, and to achieve an optimized performance and operation.

Overall speaking, the interleaved patterns are intentionally made in two self-aligned reverse patterning processes in the fabricating method of the present disclosure, with a mask pattern formed in the first self-aligned reverse patterning process overlapping with and being not cut off by a short-end of an opening formed in the second self-aligned reverse patterning process, and with a transferring pattern corresponding to the mask pattern being cut off by a transferring pattern corresponding to the opening, to form two extension pads, or an extension pad and a branch extension pad, both having an arc side. In this way, the extension pads and/or branch extension pads with various lengths are formed at the outer periphery of the extension pad array, and the storage node pads formed adjacent to the extension pads and/or branch extension pads with various lengths enable to obtain a complete outline and a uniform length, without generating any structural defects. That is, the semiconductor device of the present disclosure will therefore obtain an improved components and more reliable structure, to achieve an optimized performance and operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a plurality of first extension pads, separately arranged in a first direction and a second direction, wherein each of the first extension pads comprises a first length in the first direction;

an extension margin disposed at one side of all of the first extension pads and extending in a third direction, the extension margin comprising a plurality of branch extension pads in the first direction;

a plurality of second extension pads, separately disposed between the branch extension pads in the third direction, wherein each of the second extension pads comprises a second length in the first direction; and at least one third extension pad, disposed between a corresponding one of the second extension pads and the first extension pads, or disposed between a corresponding one of the branch extension pads and the first extension pads, wherein the at least one third extension pad comprises a third length in the first direction;

wherein the third length is larger than the first length and is smaller than the second length.

2. The semiconductor device according to claim 1, wherein the at least one third extension pad comprises a first side and a second side opposite to each other, and a length of the first side in the first direction is smaller than a length of the second side in the first direction.

3. The semiconductor device according to claim 2, wherein the at least one third extension pad further comprises an arc-shaped side opposite to another arc-shaped side disposed on the corresponding one of the second extension pads or on the corresponding one of the branch extension pads.

4. The semiconductor device according to claim 2, wherein the corresponding one of the second extension pads or the corresponding one of the branch extension pads further comprises a third side and a fourth side opposite to each other, and a length of the third side in the first direction is smaller than a length of the fourth side in the first direction.

5. The semiconductor device according to claim 4, wherein the first side and the third side of the corresponding one of the second extension pads or the corresponding one of the branch extension pads are colinear, and the second side and the fourth side of the corresponding one of the second extension pads or the corresponding one of the branch extension pads are colinear.

6. The semiconductor device according to claim 1, wherein the extension margin further comprises at least one first edge in a fourth direction being perpendicular to the third direction, and at least one second edge in the third direction, and the branch extension pads are disposed on the at least one second edge.

7. The semiconductor device according to claim 6, wherein the corresponding one of the second extension pads and the corresponding one of the branch extension pads each is disposed between the at least one second edge and all of the first extension pads.

8. The semiconductor device according to claim 1, further comprising:

a plurality of the third extension pads, and two of the third extension pads being respectively disposed between one of the second extension pads and the first extension pads, and between one of the branch extension pads and the first extension pads.

9. The semiconductor device according to claim 8, wherein each of the third extension pads comprises an arc-shaped side, and the arc-shaped sides of the two of the third extension pads are respectively opposite to an arc-shaped side of the corresponding one of the second extension pads and an arc-shaped side of the corresponding one of the branch extension pads.

10. The semiconductor device according to claim 9, wherein the corresponding one of the second extension pads and the corresponding one of the branch extension pads respectively comprises a third side and a fourth side opposite to each other, and a length of the third side in the first direction is smaller than a length of the fourth side in the first direction.

11. The semiconductor device according to claim 1, further comprising:

a substrate; and a dielectric layer, disposed on the substrate, around each of the first extension pads, each of the second extension pads, the at least one third extension pad, and the extension margin, wherein a portion of the dielectric layer is sandwiched between the at least one third extension pad and the extension margin.

12. A fabricating method of a semiconductor device, comprising:

forming a plurality of first extension pads separately arranged in a first direction and a second direction, wherein each of the first extension pads comprises a first length in the first direction;

forming an extension margin disposed at one side of all of the first extension pads and extending in a third direction, the extension margin comprising a plurality of branch extension pads in the first direction;

forming a plurality of second extension pads separately between the branch extension pads in the third direction, wherein each of the second extension pads comprises a second length in the first direction; and forming at least one third extension pad between a corresponding one of the second extension pads and the first extension pads, or between a corresponding one of the branch extension pads and the first extension pads, wherein the at least one third extension pad comprises a third length in the first direction;

wherein the third length is larger than the first length and is smaller than the second length.

13. The fabricating method of the semiconductor device according to claim 12, further comprising:

providing a substrate;

forming a conductive material layer on the substrate;

forming a hard mask layer and a mask layer on the conductive material layer;

forming a first mask structure on the hard mask layer, the first mask structure comprising a plurality of first mask patterns separately extending in the first direction and comprising a rectangular frame pattern;

forming a second mask structure on the hard mask layer, the second mask structure comprising a plurality of second mask patterns interleaving the first mask patterns, each of the second mask patterns separately extending in the second direction and comprising a rectangular frame pattern; and performing an etching process through the first mask patterns and the second mask patterns, to pattern the mask layer.

14. The fabricating method of the semiconductor device according to claim 13, wherein the etching process further comprising:

before forming the second mask structure, performing a first etching process through the first mask patterns to form a plurality of mask patterns and a plurality of first openings in the first direction within the mask layer; and performing a second etching process through the second mask patterns, to form a plurality of second openings interleaving the first openings within the mask layer, wherein one of the mask patterns being cut off by one of the second openings.

15. The fabricating method of the semiconductor device according to claim 14, wherein the one of the mask patterns physically contacts a mask margin.

16. The fabricating method of the semiconductor device according to claim 15, wherein the one of the mask patterns does not contact a mask margin.

17. The fabricating method of the semiconductor device according to claim 15, further comprising:

after performing the second etching process, etching the hard mask layer and the conductive material layer through the mask layer; and forming a dielectric layer on the substrate, around each of the first extension pads, the second extension pads, the at least one third extension pad, and the extension margin.

18. The fabricating method of the semiconductor device according to claim 12, wherein the extension margin further comprises at least one first edge in a fourth direction being perpendicular to the third direction, and at least one second edge in the third direction, the branch extension pads are disposed on the at least one second edge, and the corresponding one of the second extension pads and the corresponding one of the branch extension pads are respectively disposed between the at least one second edge and all of the first extension pads.

19. The fabricating method of the semiconductor device according to claim 12, wherein the at least one third extension pad comprises a first side and a second side opposite to each other, and a length of the first side in the first direction is smaller than a length of the second side in the first direction.

20. The fabricating method of the semiconductor device according to claim 12, wherein the at least one third extension pad comprises an arc-shaped side opposite to another arc-shaped side disposed on the corresponding one of the second extension pads or the corresponding one of the branch extension pads.

* * * * *